United States Patent
Eun et al.

(10) Patent No.: US 7,831,881 B2
(45) Date of Patent: Nov. 9, 2010

(54) APPARATUS AND METHOD FOR HYBRID DETECTION OF MEMORY DATA

(75) Inventors: Heeseok Eun, Yongin-si (KR); Jae Hong Kim, Seoul (KR); Jun Jin Kong, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 238 days.

(21) Appl. No.: 12/230,832

(22) Filed: Sep. 5, 2008

(65) Prior Publication Data

US 2009/0235129 A1    Sep. 17, 2009

(30) Foreign Application Priority Data

Mar. 12, 2008    (KR)    .................... 10-2008-0022962

(51) Int. Cl.
*H04L 1/00* (2006.01)

(52) U.S. Cl. ............... 714/746; 714/2; 714/5; 714/42; 714/48; 714/54; 714/704; 714/718; 714/722; 714/799; 714/800; 714/807; 714/810; 365/185.03; 365/185.09; 365/185.33; 365/200; 365/201

(58) Field of Classification Search .................. None
See application file for complete search history.

(56) References Cited

U.S. PATENT DOCUMENTS

| | | | | |
|---|---|---|---|---|
| 5,901,089 | A * | 5/1999 | Korsh et al. | 365/185.24 |
| 6,772,383 | B1 * | 8/2004 | Quach et al. | 714/746 |
| 7,242,615 | B2 * | 7/2007 | Nagashima | 365/185.09 |
| 2005/0102595 | A1 * | 5/2005 | Seo | 714/736 |
| 2006/0209593 | A1 * | 9/2006 | Toda | 365/185.03 |
| 2007/0091677 | A1 * | 4/2007 | Lasser et al. | 365/185.09 |
| 2007/0201274 | A1 * | 8/2007 | Yu et al. | 365/185.09 |
| 2007/0277060 | A1 * | 11/2007 | Cornwell et al. | 714/54 |
| 2008/0123420 | A1 * | 5/2008 | Brandman et al. | 365/185.09 |
| 2008/0192544 | A1 * | 8/2008 | Berman et al. | 365/185.09 |

(Continued)

FOREIGN PATENT DOCUMENTS

JP    2004-524643    8/2004

(Continued)

OTHER PUBLICATIONS

International Search Report dated Jan. 14, 2009.

*Primary Examiner*—John P Trimmings
(74) *Attorney, Agent, or Firm*—Harness, Dickey, & Pierce, P.L.C.

(57) ABSTRACT

The data detecting apparatus may provide a voltage comparison unit that compares a reference voltage, associated with a specific data bit from among a plurality of data bits stored in a memory cell, with a threshold voltage in the memory cell, a detection unit that detects a value of the specific data bit based on a result of the voltage comparison unit, and a decision unit that decides whether the specific data bit is successfully detected based on whether an error occurs in the detected data. The detection unit may re-detect a value of the specific data bit based on detection information with respect to at least one of an upper data bit and a lower data bit in relation to the specific data bit, in response to a result of the decision unit.

19 Claims, 7 Drawing Sheets

U.S. PATENT DOCUMENTS

2010/0070799 A1 * 3/2010 Cornwell et al. ................ 714/5

FOREIGN PATENT DOCUMENTS

| KR | 10-2006-0094502 | 12/2002 |
| KR | 10-2006-0064856 | 6/2006 |
| KR | 10-2006-0112413 | 11/2006 |
| WO | WO 02/082447 | 10/2002 |

* cited by examiner

FIG. 2

| DURATIONS / SEQUENCES OF BITS | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 1 | 1 | 1 | 1 | 1 | 1 | 1 | 1 | 1 | -1 | -1 | -1 | -1 | -1 | -1 | -1 | -1 |
| 2 | 1 | 1 | 1 | 1 | -1 | -1 | -1 | -1 | -1 | -1 | -1 | -1 | 1 | 1 | 1 | 1 |
| 3 | 1 | 1 | -1 | -1 | -1 | -1 | 1 | 1 | 1 | 1 | -1 | -1 | -1 | -1 | 1 | 1 |
| 4 | 1 | -1 | -1 | 1 | 1 | -1 | -1 | 1 | 1 | -1 | -1 | 1 | 1 | -1 | -1 | 1 |

APPARATUS AND METHOD FOR HYBRID DETECTION OF MEMORY DATA

PRIORITY STATEMENT

This application claims priority under 35 U.S.C. §119 to Korean Patent Application No. 10-2008-0022962, filed on Mar. 12, 2008, in the Korean Intellectual Property Office (KIPO), the entire contents of which are incorporated herein by reference.

BACKGROUND

1. Field

Example embodiments relate to an apparatus and method for detecting data stored in a memory cell, and more particularly, to apparatuses and methods for hybrid detection that performs hard decision detection and soft decision detection.

2. Description of Related Art

A single-level cell (SLC) memory device may store one data bit in a single memory cell. The SLC memory may be referred to as a single-bit cell (SBC) memory. The SLC memory may store and read one data bit at a voltage level included in two distributions that are divided by a threshold voltage level programmed in a memory cell. The programmed threshold voltage has a distribution within a certain range due to a fine electric characteristic difference between the SLC memories. For example, when a voltage level read from the memory cell is greater than 0.5V and less than 1.5V, it may be determined that the data stored in the memory cell has a logic value of "1". When the voltage level read from the memory cell is greater than 2.5V and less than 3.5V, it may be determined that the data stored in the memory cell has a logic value of "0". The data stored in the memory cell may be classified depending on the difference between cell currents and/or cell voltages during the reading operations.

Meanwhile, a multi-level cell (MLC) memory device that may store data of two or more bits in a single memory cell has been proposed in response to a need for higher integration of memory. The MLC memory device may also be referred to as a multi-bit cell (MBC) memory. However, as the number of bits stored in the single memory cell increases, reliability deteriorates and read-failure rate may increase. To store "m" bits in a single memory cell, $2^N$ voltage level distributions may be required. However, since the voltage window for a memory device is limited, the difference in threshold voltage between adjacent bits may decrease as "N" increases, causing the read-failure rate to increase. For this reason, it may be difficult to improve storage density using the MLC memory device according to conventional art.

SUMMARY

Example embodiments may provide apparatuses and methods to perform soft decision with respect to a target detection bit based on a hard decision reference voltage associated with a lower bit of target detection data bits or detection information with respect to a lower bit of the target detection data bits.

Also, example embodiments may provide apparatuses and methods to detect data of a target detection bit based on detection information with respect to an upper data bit of the target detection data bits and detection information with respect to a lower data bit of the target detection data bits. A target detection bit may also be referred to as a specific data bit and target detection data bits may also be referred to as simply a plurality of data bits or data bits.

Example embodiments may provide a data detecting apparatus that includes a voltage comparison unit that compares a reference voltage, associated with a specific data bit from among a plurality of data bits stored in a memory cell, with a threshold voltage in the memory cell, a detection unit that detects a value of the specific data bit based on a result of the voltage comparison unit, and a decision unit that decides whether the specific data bit is successfully detected based on whether an error occurs in the detected data. The detection unit may re-detect a value of the specific data bit based on detection information with respect to at least one of an upper data bit and a lower data bit in relation to the specific data bit, in response to a result of the decision unit.

Example embodiments may also provide a method for detecting data that includes comparing a reference value, associated with a specific data bit from among a plurality of data bits stored in a memory cell, with a threshold voltage in the memory cell, detecting a value of the specific data bit based on the comparing the reference voltage, and deciding whether the specific data bit is successfully detected based on whether an error occurs in the detected data. The detecting may re-detect a value of the specific data bit based on detection information with respect to at least one of a lower data bit and an upper data bit in relation the specific data bit, according to the deciding.

According to example embodiments, a soft decision may be performed with respect to a target detection bit based on a hard decision reference voltage associated with a lower bit of the target detection data bits or detection information with respect to the lower data bit of the target detection data bits.

According to example embodiments, a target detection bit may be detected based on detection information with respect to an upper data bit of the target detection data bits and detection information with respect to a lower data bit of the target detection data bits.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," or "coupled to" to another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1:
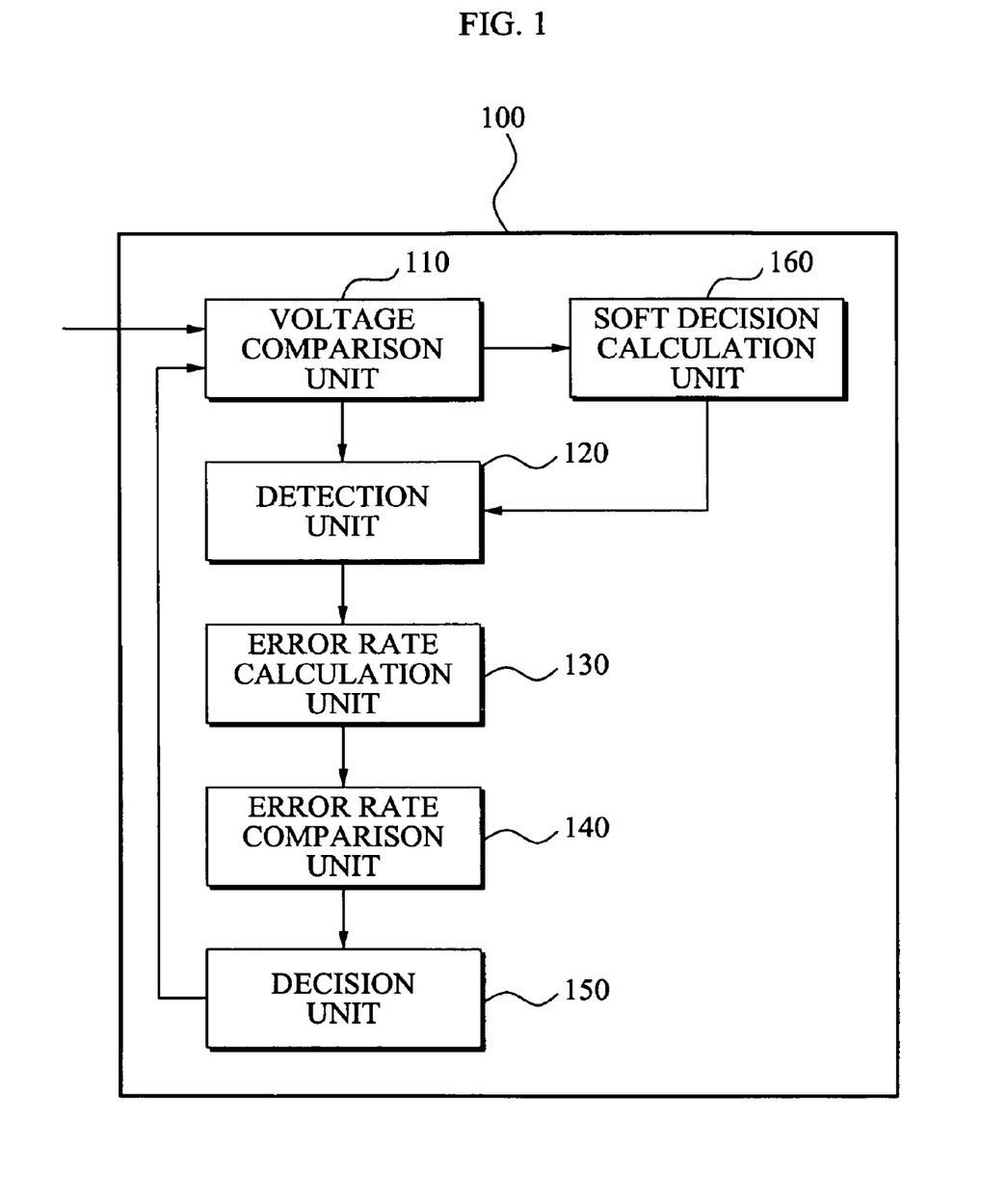
FIG. 1 is a block diagram illustrating a configuration of a data detecting apparatus according to example embodiments.

FIG. 1 is a block diagram illustrating a configuration of a data detecting apparatus according to example embodiments. Hereinafter, operations of the data detecting apparatus, according to example embodiments, will be described in detail by referring to FIG. 1. The data detecting apparatus 100 includes a voltage comparison unit 110, a detection unit 120, an error rate calculation unit 130, an error rate comparison unit 140, a decision unit 150, and/or a soft decision calculation unit 160.

The voltage comparison unit 110 may compare a reference voltage, associated with a specific data bit from among a plurality of data bits stored in a memory cell (not shown), with a threshold voltage in the memory cell. The threshold voltage in the memory cell may be decided by data stored in the memory cell. The value of the specific data bit may be decided by comparing the threshold voltage in the memory cell with the reference voltage associated with the specific data bit.

The detection unit 120 may detect a value of the specific data bit based on the comparison result in the voltage comparison unit 110. According to example embodiments, a range of the threshold voltage in the memory cell may be divided into a plurality of durations by the reference voltage. For example, when a memory cell stores N-bit data, a range of a threshold voltage in the memory cell may be divided into $2^N$ number of durations by a $2^N-1$ number of reference voltages.

The detection unit 120 may determine a duration including the threshold voltage in the memory cell from among the $2^N$ numbers of durations, and detect a value stored in the memory cell based on the determined duration.

The decision unit 150 may decide whether the specific data bit is successfully detected based on whether an error occurs in the detected data.

According to example embodiments, the data stored in the memory cell is error-correction coded according to a predetermined error-correction coding scheme, and the decision unit 150 may decide whether the specific data bit is successfully detected based on the predetermined error-correction coding scheme.

According to example embodiments, the error rate calculation unit 130 may decide whether an error occurs in the data stored in the memory cell according to the error-correction coding scheme. Also, the error rate calculation unit 130 may calculate the error rate of the specific data bit based on the decision result of the decision unit 150.

According to example embodiments, the error rate comparison unit 140 may compare the error rate calculated by the error rate calculation unit 130 with a predetermined threshold error rate, and the decision unit 150 may decide whether the specific data bit is successfully detected according to the comparison result. According to example embodiments, when the calculated error rate is larger than the predetermined threshold error rate, it may be decided that detection of the specific data bit fails, and when the calculated error rate is smaller than the predetermined threshold error rate, it may be decided that the specific data bit is successfully detected.

According to the decision result of the decision unit 150, the detection unit 120 may re-detect a value of the specific data bit based on detection information with respect to an upper data bit, where the upper data bit may be a data bit having a bit sequence or position greater in value than that of the specific data bit.

According to example embodiments, the detection unit 120 may re-detect the specific data bit based on the detection information with respect to the upper data bit when the decision unit 150 has decided that detection of the specific data bit failed. The detection unit 120 may then more accurately re-detect the specific data bit since the detection unit 120 detects the specific data bit by additionally considering detection information with respect to the upper data bit as well as the detection information with respect to the specific data bit.

According to example embodiments, the detection information with respect to the upper data bit may be generated by comparing a reference voltage associated with the upper data bit to the threshold voltage in the memory cell at the voltage comparison unit 110.

The decision unit 150 may re-decide whether the specific data bit is successfully detected based on the re-detected data.

According to example embodiments, the error rate calculation unit 130 may re-calculate an error rate based on the re-detected data, and the error rate comparison unit 140 may compare the re-calculated error rate with a threshold error rate. The decision unit 150 may re-detect the specific data bit based on detection information with respect to a lower data bit according to the comparison result of the re-calculated error rate and the threshold error rate. The lower data bit may refer to the specific data bit.

According to example embodiments, the detection information with respect to the lower data bit may be generated by comparing the threshold voltage in the memory cell with a reference voltage associated with the lower data bit.

The soft decision calculation unit 160 may calculate a soft decision value with respect to the specific data bit based on the detection information with respect to the lower data bit. According to example embodiments, the detection unit 120 may detect a value of the specific data bit based on the calculated soft decision value.

Figure 2:
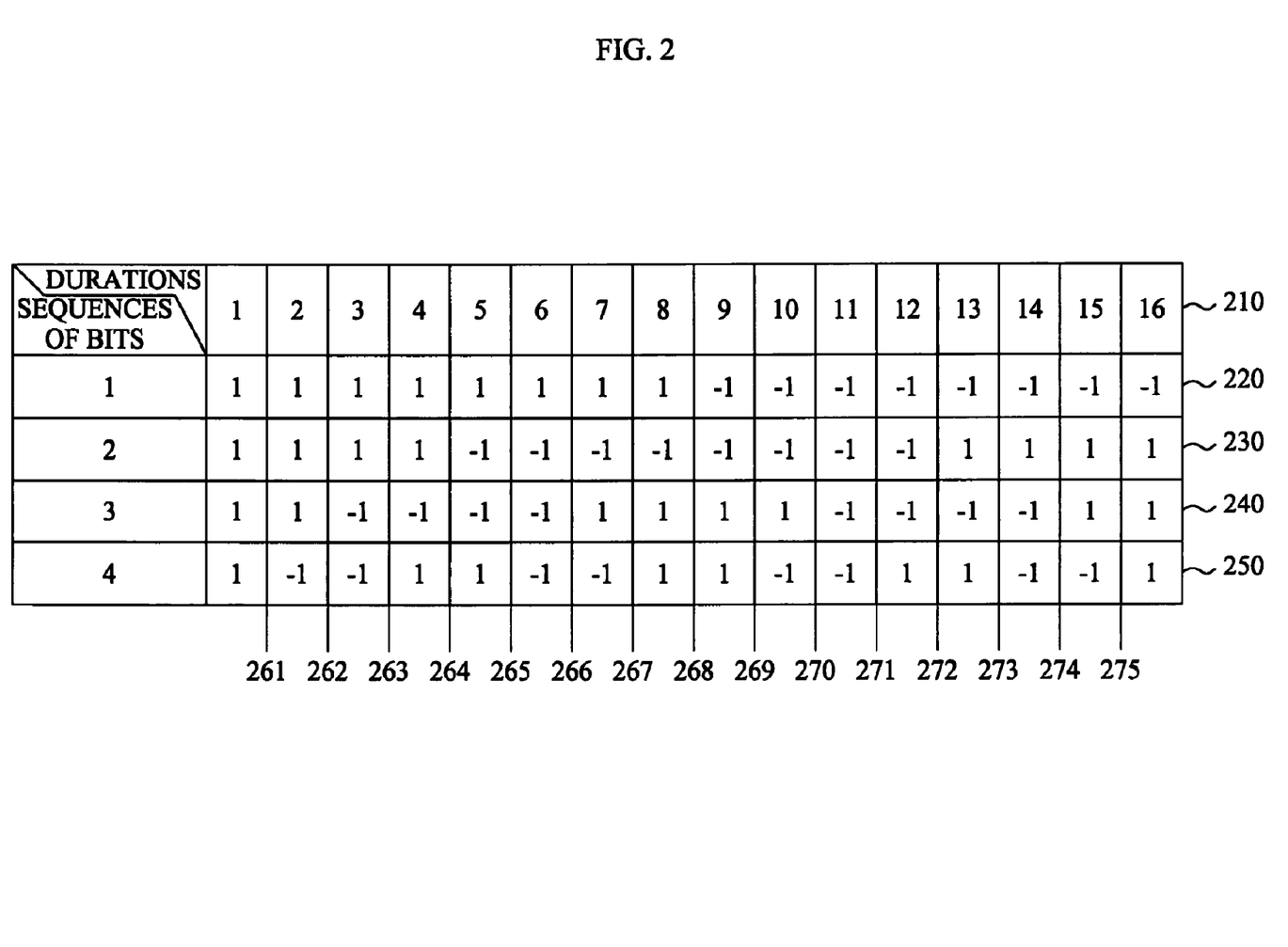
FIG. 2 is a diagram illustrating that four-bit data is stored in a memory cell according to example embodiments.

FIG. 2 is a diagram illustrating that four-bit data is stored in a memory cell according to example embodiments. Hereinafter, relation between a duration including a threshold voltage in a memory cell and data stored in the memory cell when a plurality of bits are stored in a memory cell will be described in detail by referring to FIG. 2.

When four-bit data is stored in a memory cell, a range of a threshold voltage in the memory cell may be divided into sixteen durations as shown in a top row 210. Each duration is divided by reference voltages 261 through 275. Four-bit data 220, 230, 240, and 250 is stored in each memory cell.

A data detecting apparatus may detect a value of data stored in the memory cell according to a duration including the threshold voltage in a memory cell. As an example, when a threshold voltage in a memory cell is included in a $7^{th}$ duration, it may be decided that data stored in the memory cell is 1, −1, 1, and −1.

According to example embodiments, the specific data bit may be read from among the plurality of data bits.

According to example embodiments, from among the plurality of data bits stored in the memory cell, a $1^{st}$ data bit has a value of 1 in durations 1 through 8, and has a value of −1 in durations 9 through 16. To read a value of the $1^{st}$ data bit, a reference voltage 268 distinguishing between a duration 8 and a duration 9 may be compared with a threshold voltage in a memory cell. Therefore, the value of the $1^{st}$ data bit may be decided with one time comparison. The reference voltage 268 distinguishing the duration 8 from the duration 9 may be referred to as a reference voltage associated with the $1^{st}$ data bit.

According to example embodiments, from the plurality of data bits, to read a value of a $2^{nd}$ data bit, a reference voltage 264 distinguishing a duration 4 from a duration 5, a reference voltage 272 distinguishing a duration 12 from a duration 13, and the threshold voltage in the memory cell may be compared with each other. To read the value of the $2^{nd}$ data bit, each of the reference voltages 264 and 272 may be respectively compared with the threshold voltage in the memory cell. The reference voltage 264 distinguishing the duration 4 from the duration 5 and the reference voltage 272 distinguishing the duration 12 from the duration 13 may be referred to as reference voltages associated with the $2^{nd}$ data bit. However, the reference voltage 268 distinguishing the duration 8 from the duration 9 is not a reference voltage associated with the $2^{nd}$ data bit since the reference voltage 268 is not required to be compared with the $2^{nd}$ data bit.

Similarly, to read a value of a $3^{rd}$ data bit, reference voltages 262, 266, 270, and 274 may be compared with the threshold voltage in the memory cell. Also, to read a value of a $4^{th}$ data bit, reference voltages 261, 263, 265, 267, 269, 271, 273, and 275 may be compared with the threshold voltage in the memory cell.

Referring to FIGS. 1 and 2, according to example embodiments, the detection unit 120 may detect the specific data bit based on a comparison result of the threshold voltage in the memory cell with a reference voltage associated with a lower bit of the specific data bit.

As an example, the detection unit 120 may further consider a comparison result of the threshold voltage in the memory cell with reference voltages 262, 266, 270, and 274 associated with the $3^{rd}$ data bit to detect the $2^{nd}$ data bit from a plurality of data bits stored in the memory cell. The comparison result of the threshold voltage and the reference voltages 262, 266, 270, and 274 associated with the $3^{rd}$ data bit may provide more detailed information with respect to a duration including the threshold voltage in the memory cell.

For example, after comparing the threshold voltage with the reference voltages 264 and 272 associated with the $2^{nd}$ data bit, information that the threshold voltage in the memory cell exists between the reference voltages 264 and 272 may only provide information that the threshold voltage in the memory cell is included in durations 5 through 12. However, after comparing the threshold voltage in the memory cell with reference voltages 262, 266, 270, and 274 associated with the $3^{rd}$ data bit, information that the threshold voltage in the memory cell exists between a second reference voltage 262 and a $6^{th}$ reference voltage 266 may provide information that the threshold voltage in the memory cell is included in durations 3 through 6. Consequently, integrating the comparison result between the threshold voltage in the memory cell and the reference voltages 264 and 266 associated with the $2^{nd}$ bit and the comparison result between the threshold voltage in the memory cell and the reference voltages 262, 266, 270, and 274, the threshold voltage in the memory cell provides information that the threshold voltage in the memory cell is included in durations 5 through 6.

According to example embodiments, the detection unit 120 may detect data based on rough information with respect to a duration including the threshold voltage in the memory cell from among $2^N$ number of durations, not accurate information with respect to the duration.

As an example, when a $2^{nd}$ data bit is detected from among a plurality of data bits, the $2^{nd}$ data bit may be detected by exclusively comparing a reference voltage associated with the $2^{nd}$ data bit with a threshold voltage in a memory cell. However, an accurate duration including the threshold voltage may not be calculated by exclusively using the comparison of the reference voltage associated with the $2^{nd}$ data bit with the threshold voltage in the memory cell. The $2^{nd}$ bit may be detected when using information that the threshold voltage is included in durations 5 through 12, and such a detection method may be referred to as a hard decision. When the threshold voltage is included in durations 5 or 12, an error rate may be comparatively large during the course of detecting data, however the hard decision may not reflect this.

Conversely, the detection unit 120 may more accurately detect the $2^{nd}$ bit based on detailed information with respect to a duration including the threshold voltage. When it is clear that the $2^{nd}$ bit is included in a duration 7 or a duration 8, an error rate may be comparatively small during the course of detecting data. When there is detailed information with respect to the duration including the threshold voltage, the $2^{nd}$ bit may be more accurately detected by considering the detailed information. Such a detection method may be referred to as a soft decision.

Generally, data may be more accurately detected when using the soft decision than the hard decision since an error rate in data is reflected in the soft decision which may consider detailed information with respect to a duration including a threshold voltage, and data may be detected.

However, to detect data based on the soft decision, a larger number of operations that compare a reference voltage with a threshold voltage may be needed to obtain detailed information with respect to the duration including the threshold voltage, accordingly a required time for detection may increase.

According to example embodiments, the soft decision calculation unit 160 may calculate a soft decision value according to the duration including the threshold voltage in the memory cell. The soft decision calculation unit 160 may calculate different soft decision values in a case that the $2^{nd}$ bit is included in the duration 5 or the duration 6, or in a case that the $2^{nd}$ bit is included in the duration 7 through 12. The detection unit 120 may accurately detect the $2^{nd}$ data bit based on the soft decision value.

According to example embodiments, the soft decision value calculated in the soft decision calculation unit 160 may be a log likelihood ratio (LLR) with respect to a duration including a threshold voltage.

According to example embodiments, the data stored in the memory cell may be coded according to a Convolutional coding scheme, a Bose-Chadhuri-Hocquenghem coding scheme, a Time Compression Multiplexing (TCM) coding scheme, a Block Coded Modulation (BCM) coding scheme, a Reed-Solomon coding scheme, a Turbo coding scheme, and the like. The detection unit 120 may detect data by decoding the data stored in the memory cell based on an error-correction decoding scheme corresponding to an error-correction coding scheme.

According to an example embodiments, a hard decision may be performed with respect to a specific data bit to detect data, and a soft decision may be selectively performed only when the hard decision fails. Therefore, a required time for detecting data may be reduced, and performance of detecting data may be maintained while an error rate is smaller than a threshold error rate.

The data detecting apparatus according to example embodiments, may be a hybrid data detecting apparatus since a hard decision or a soft decision may be selectively performed depending on whether data is successfully detected or not.

FIGS. 3A through 3D are graphs illustrating a soft decision value, a hard decision value, and a reference voltage with respect to each data bit when a plurality of data bits are stored in a memory cell according to example embodiments. Hereinafter, a case that a soft decision value with respect to each data bit when a plurality of bits are stored in a memory cell will be described in detail by referring to FIGS. 3A through 3D.

Figure 3A:
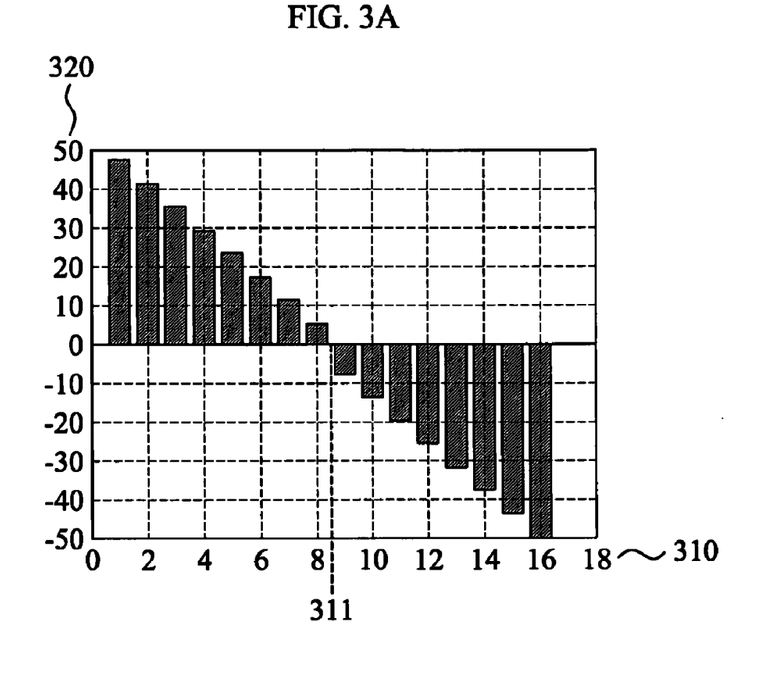
FIGS. 3A through 3D are graphs illustrating a soft decision value, a hard decision value, and a reference voltage with respect to each data bit when a plurality of data bits is stored in a memory cell according to example embodiments.

FIG. 3A is a graph illustrating soft decision values which are calculated with respect to a $1^{st}$ bit when four-bit data is stored in a memory cell. A horizontal axis 310 indicates a number of duration which may include a threshold voltage, and a vertical axis 320 indicates soft decision values which are calculated with respect to each duration. As described in FIG. 2, when a threshold voltage is included in durations 1 through 8, a $1^{st}$ bit may be decided to be 1, and when a threshold voltage is included in durations 9 through 16, the $1^{st}$ bit may be decided to be −1. The durations 1 through 8 and the durations 9 through 16 may be distinguished by a reference voltage 311 associated with the $1^{st}$ bit.

When a threshold voltage is included in a duration 1 or included in a duration 16, there is a high possibility that each of the $1^{st}$ bit stored in the memory cell may be 1 or may be −1. According to example embodiments, in this instance, the soft decision calculation unit 160 of FIG. 1 may calculate a soft decision value having a relatively large absolute value with respect to each duration. However, when a threshold voltage is included in the duration 8 or is included in the duration 9, there is a comparatively lower possibility that each of the $1^{st}$ bit stored in the memory cell may be 1 or may be −1. This is because the threshold voltage stored in the memory cell may possibly change over time. A threshold voltage at a point of data being stored in a memory cell may be included in a duration 8, and a threshold voltage at a point of data being detected in a memory cell may be included in the duration 9, and vice versa.

Depending on a duration including a threshold voltage in a memory cell, a probability that each bit in a memory cell is successfully detected changes. According to example embodiments, the soft decision calculation unit 160 may calculate a soft decision value by considering the detection success probability, which changes depending on the duration including the threshold voltage in the memory cell, and the detection unit 120 may detect data stored in the memory cell based on the soft decision value.

Figure 3B:
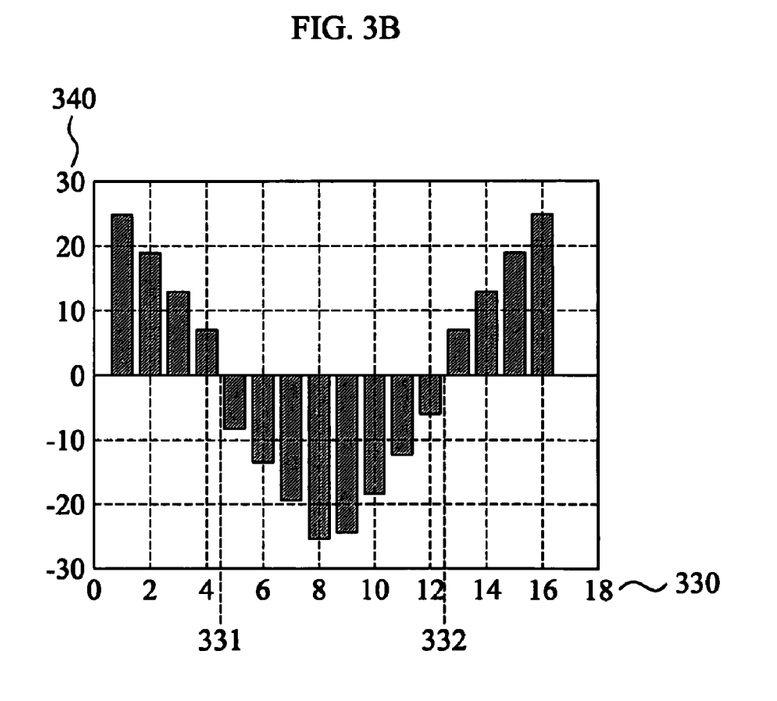

FIG. 3B is a graph illustrating a soft decision value which is calculated with respect to a $2^{nd}$ bit when four-bit data is stored in a memory cell. A horizontal axis 330 indicates a number of durations which may include a threshold voltage, and a vertical axis 340 indicates soft decision values which are calculated with respect to each duration. As described in FIG. 2, the $2^{nd}$ bit may be decided to be 1 when a threshold voltage is included in durations 1 through 4, the $2^{nd}$ bit may be decided to be −1 when a threshold voltage is included in durations 5 through 12, and the $2^{nd}$ bit may be decided to be 1 when a threshold voltage is included in durations 13 through 18. The durations 1 through 4, the durations 5 through 12, and the durations 13 through 18 may be distinguished by reference voltages 331 and 332 associated with the $2^{nd}$ bit.

According to example embodiments, the soft decision calculation unit 160 may respectively calculate a soft decision value depending on a duration including a threshold voltage in a memory cell, and the detection unit 120 may detect a value of the $2^{nd}$ data bit based on the soft decision value.

Figure 3C:
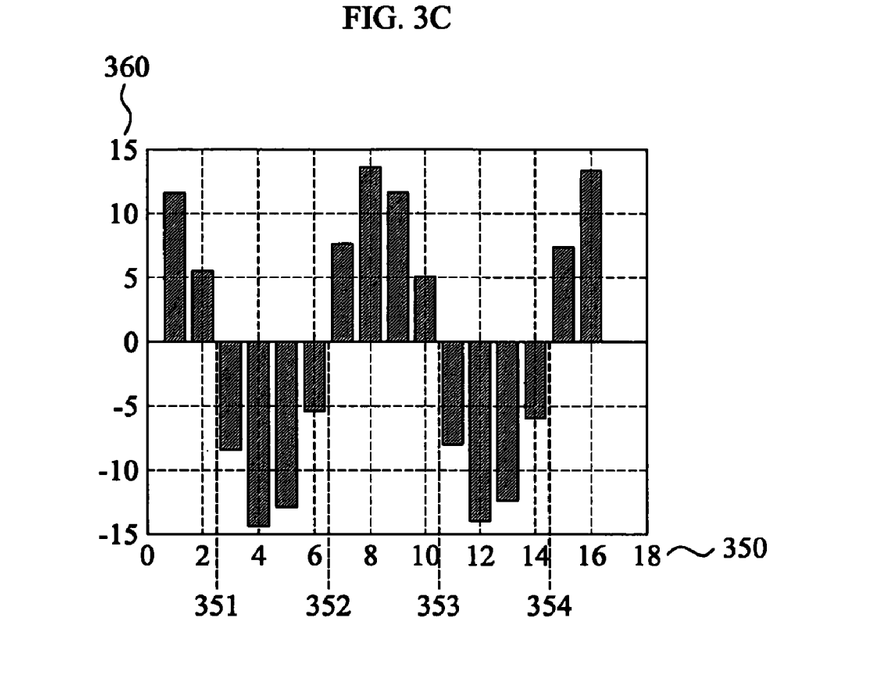

FIG. 3C is a graph illustrating a soft decision value which is calculated with respect to a $3^{rd}$ bit when four-bit data is stored in a memory cell. A horizontal axis 350 indicates a number of durations which may include a threshold voltage, and a vertical axis 360 indicates soft decision values which are calculated with respect to each duration. Each duration where values of the $3^{rd}$ bit are decided to be different from each other may be distinguished by reference voltages 351, 352, 353, and 354.

According to example embodiments, the soft decision calculation unit 160 may respectively calculate a soft decision value depending on a duration including a threshold voltage in a memory cell, and the detection unit 120 may detect a value of the $3^{rd}$ data bit.

Figure 3D:
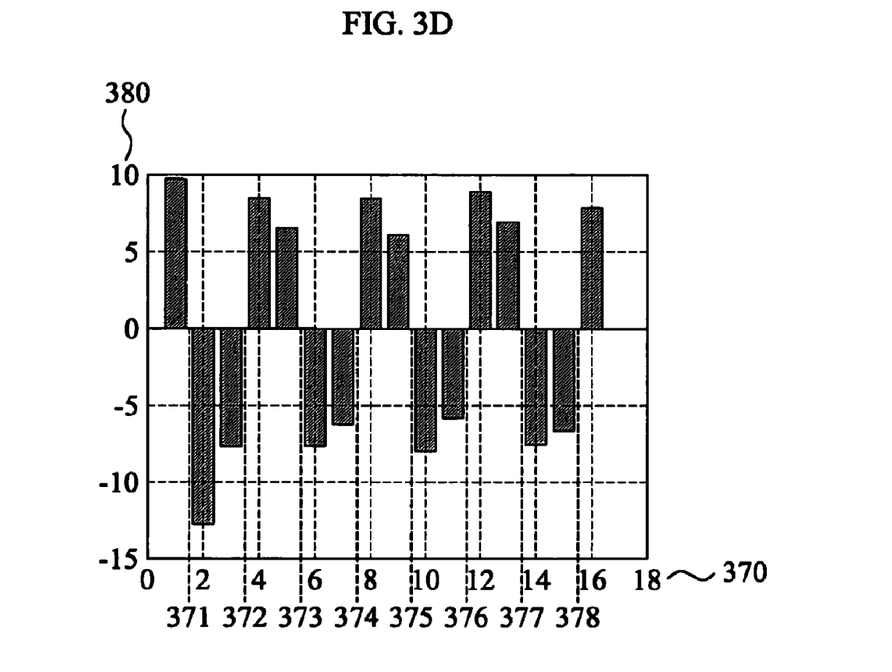

FIG. 3D is a graph illustrating a soft decision value with respect to a $4^{th}$ bit when four-bit data is stored in a memory cell. A horizontal axis 370 indicates a number of durations which may include a threshold voltage, and a vertical axis 380 indicates soft decision values which are calculated with respect to each duration. Each duration, where values of the $4^{th}$ bit are decided to be different from each other, may be distinguished by reference voltages 371, 372, 373, 374, 375, 376, 377, and 378.

According to example embodiments, the soft decision calculation unit 160 may respectively calculate a soft decision value depending on a duration including a threshold voltage in a memory cell, and the detection unit 120 may detect a value of the $4^{th}$ data bit.

According to example embodiments, a data detecting apparatus may exclusively detect the $3^{rd}$ data bit. The data detecting apparatus may identify a duration including a threshold voltage in a memory cell by comparing the threshold voltage in the memory cell with the reference voltages 351, 352, 353, and 354 associated with the $3^{rd}$ bit. When the threshold voltage is included in a duration between a first reference voltage 351 and a second voltage 352 from among the reference voltages 351, 352, 353, and 354, the data detecting apparatus may decided the $3^{rd}$ data bit to be −1.

According to example embodiments, when it is decided that an error occurs in the $3^{rd}$ bit, the $3^{rd}$ data bit may be re-detected based on detection information with respect to an upper data bit.

According to example embodiments, the detection information with respect to the upper data bit may be information which is generated by comparing the threshold voltage in the memory cell with a reference voltage associated with each of the upper bits. Detection information with respect to a $1^{st}$ bit may be generated by comparing a threshold voltage in a memory cell with a reference voltage 311 associated with the $1^{st}$ bit. According to example embodiments, when the threshold voltage in the memory cell is smaller than the reference voltage 311 associated with the $1^{st}$ bit, the detection information with respect to the $1^{st}$ bit may denote that the threshold voltage in the memory cell is included in durations 1 through 8.

Detection information with respect to a $2^{nd}$ bit may be generated by comparing a threshold voltage in a memory cell with reference voltages 331 and 332 associated with the $2^{nd}$ bit. According to example embodiments, when the threshold voltage in the memory cell is smaller than a first reference voltage 331 from among the reference voltages 331 and 332 associated with the $2^{nd}$ bit, the detection information with respect to the $2^{nd}$ bit may denote that the threshold voltage in the memory cell is included in durations 1 through 4.

Integrating the detection information with respect to the upper bit and detection information with respect to a $3^{rd}$ bit, a threshold voltage in a memory cell may be determined to be included in durations 3 through 4.

According to example embodiments, a plurality of data bits stored in the memory cell may be error-correction coded by combining with a bit in a same location being stored in another memory. For example, a $1^{st}$ data bit in a specific memory cell may be combined with a $1^{st}$ data bit in another memory cell so that the $1^{st}$ data bit in the specific memory cell may be error-correction coded.

According to example embodiments, the data detecting apparatus may correct an error that occurred in the data based on soft decision values which are calculated depending on each duration. A decision may not be based on rough information with respect to a duration including a threshold voltage, e.g. durations 3 through 6, if a soft decision is performed based on more detailed information with respect to a duration including the threshold voltage, e.g. durations 3 through 4, by using detection information with respect to an upper data bit. A probability of error-correction increases with respect to the $3^{rd}$ data bit.

According to example embodiments, the data detecting apparatus may detect the $3^{rd}$ data bit based on the detection information with respect to a lower data bit.

Detection information with respect to the $4^{th}$ bit may be generated by comparing a threshold voltage in a memory with the reference voltages 371 through 378 associated with the $4^{th}$ bit. According to example embodiments, when a threshold voltage in the memory cell is included in a duration between a second reference voltage 372 and a third reference voltage 373, from among the reference voltages 371 through 378 associated with the $4^{th}$ bit, it may be identified that the threshold voltage in the memory cell is included in durations 4 through 5.

Integrating the detection information with respect to the $3^{rd}$ bit and detection information with respect to the upper bit and the lower bit, it may be identified that the threshold voltage in the memory cell is included in the duration 4. The data detecting apparatus may obtain more accurate information with respect to a duration including a threshold voltage in a memory cell based on detection information with respect to a lower bit. Therefore, it may be possible to detect more accurate information about data stored in the memory cell.

In the above-described embodiments in FIG. 3, it is described that the reference voltage associated with the upper bit may not correspond to a reference voltage associated with a lower bit. For example, the reference voltage 311 associated with the $1^{st}$ bit may not correspond to the reference voltages 331 and 332 associated with the $2^{nd}$ bit.

However, example embodiments may be applied to a reference voltage associated with an upper bit corresponding to a reference voltage associated with a lower bit. For example, by using the detection information with respect to the lower bit, more accurate information may be calculated with respect to a duration including a threshold voltage in a memory cell. The data detecting apparatus may detect more accurate information about data stored in the memory cell based on the more accurate information with respect to the duration including the threshold voltage in the memory cell.

According to example embodiments, a more accurate soft decision value may be calculated based on the duration including the threshold voltage, and data stored in the memory cell may be more accurately detected according to a soft decision scheme.

Figure 4:
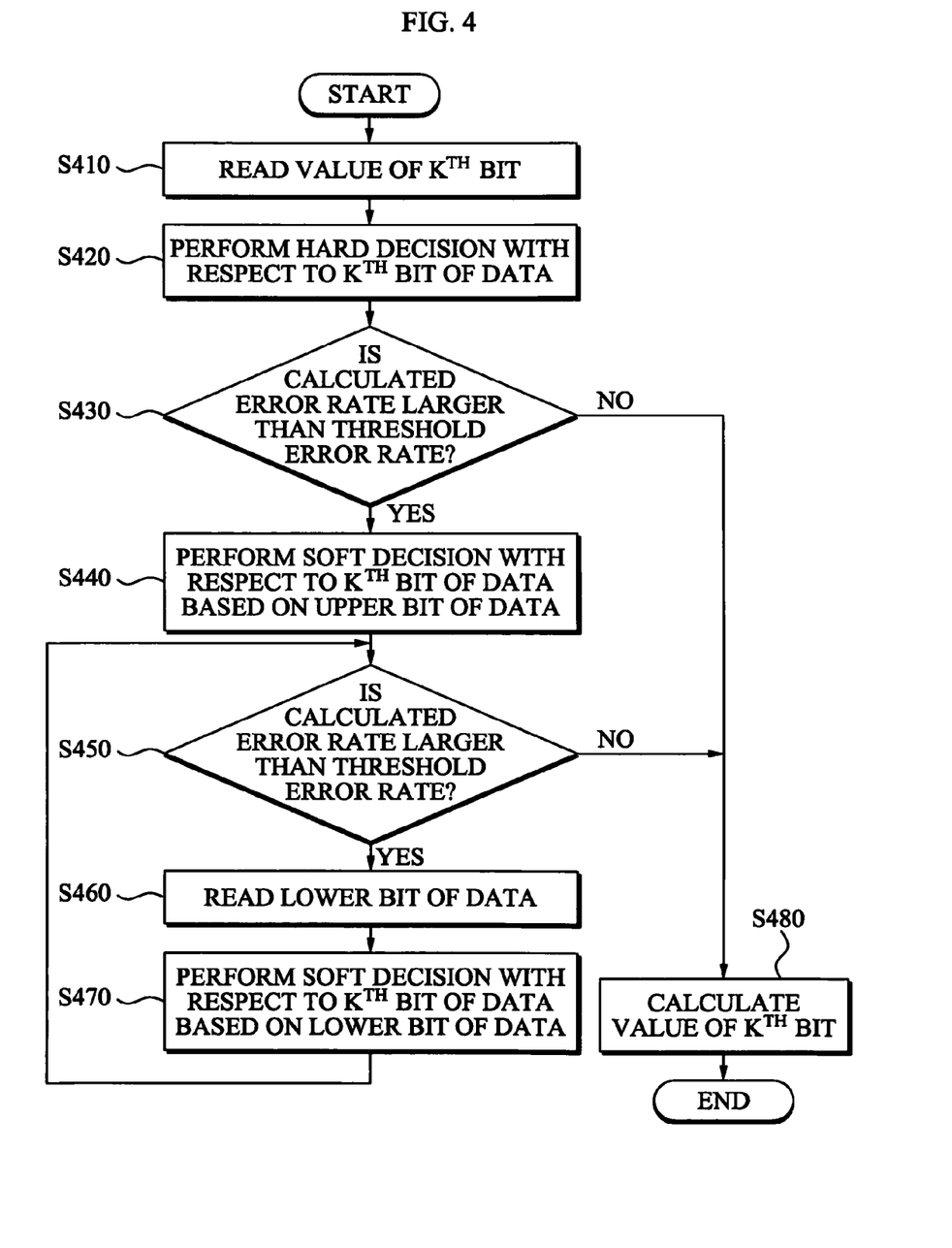
FIG. 4 is a flowchart illustrating a method for detecting a value stored in a memory cell according to example embodiments.

FIG. 4 is a flowchart illustrating a method for detecting a value stored in a memory cell according to example embodiments. Hereinafter, the method for detecting the value stored in the memory cell according to example embodiments will be described by referring to FIG. 4.

In operation S410, a value of a $k^{th}$ bit is read, where the value "k" may be an integer. Reading of the $k^{th}$ bit may refer to calculating information with respect to a duration including a threshold voltage in a memory cell by comparing the threshold voltage with a reference voltage associated with the $k^{th}$ bit.

In operation S420, a hard decision may be performed with respect to the $k^{th}$ data bit. Detecting the $k^{th}$ data bit according to information with respect to a duration, including the threshold voltage calculated from operation S410, may refer to the hard decision. When the hard decision is performed with respect to the $k^{th}$ data bit, only a comparison result of the reference voltage associated with the $k^{th}$ bit and the threshold voltage may be considered.

In operation S430, whether data is successfully detected with respect to the $k^{th}$ data bit may be decided based on whether an error occurs in the $k^{th}$ data bit. According to example embodiments, operation S420 may include operations for calculating of the error rate with respect to the detected data and the comparing of the threshold voltage with the calculated error rate. In operation S430, whether data is successfully detected according to the comparison result of error rates may be decided.

According to example embodiments, the $k^{th}$ data bit may be error-correction coded according to a predetermined error-correction coding scheme, and the calculating of the error rate may decide whether an error occurs in the $k^{th}$ data bit according to the error-correction coding scheme, thereby calculating the error rate.

According to example embodiments, when the calculated error rate is less than the threshold voltage, it may be decided that the detection is successful with respect to the $k^{th}$ data bit. In this instance, a value of the $k^{th}$ bit may be calculated in operation S480, and a detection process with respect to the $k^{th}$ bit may be terminated.

According to example embodiments, when the calculated error rate is larger than the threshold voltage, the $k^{th}$ data bit may be re-detected based on detection information with respect to a higher data bit than the $k^{th}$ bit in operation S440. According to example embodiments, a soft decision may be performed with respect to the $k^{th}$ data bit based on the detection information with respect to the upper data bit in operation S440.

According to example embodiments, a hard decision may be performed with respect to the $k^{th}$ data bit in operation S420. Conversely, a soft decision may be performed with respect to the $k^{th}$ data bit in operation S440. Since either a hard decision or a soft decision is selectively performed with respect to identical data depending on a predetermined condition, example embodiments may be referred to as a hybrid detection method.

In operation S450, whether the data being re-detected based on the detection information with respect to the upper data bit is successfully detected may be re-decided. According to example embodiments, when the $k^{th}$ data bit is successfully detected, a value of the $k^{th}$ data bit may be calculated in operation S480, and a detection process may be terminated with respect to the $k^{th}$ data bit.

In operation S450, when re-detection of the $k^{th}$ data bit fails, detection information with respect to a lower data bit than the $k^{th}$ bit may be read to generate the detection information in operation S460. According to example embodiments, the detection information with respect to the lower data bit may be generated by comparing the threshold voltage in the memory cell with a reference voltage associated with the lower data bit.

In operation S470, the $k^{th}$ data bit may be re-detected based on the generated detection information with respect to the lower data bit. According to example embodiments, a soft decision may be performed with respect to the $k^{th}$ data bit based on the detection information with respect to the lower data bit.

According to example embodiments, operation S470 may calculate a soft decision value with respect to the $k^{th}$ data bit based on the detection information with respect to the lower data bit, and may detect a value of the $k^{th}$ bit based on the calculated soft decision value. Next, the method may flow back to operation S450.

Figure 5:
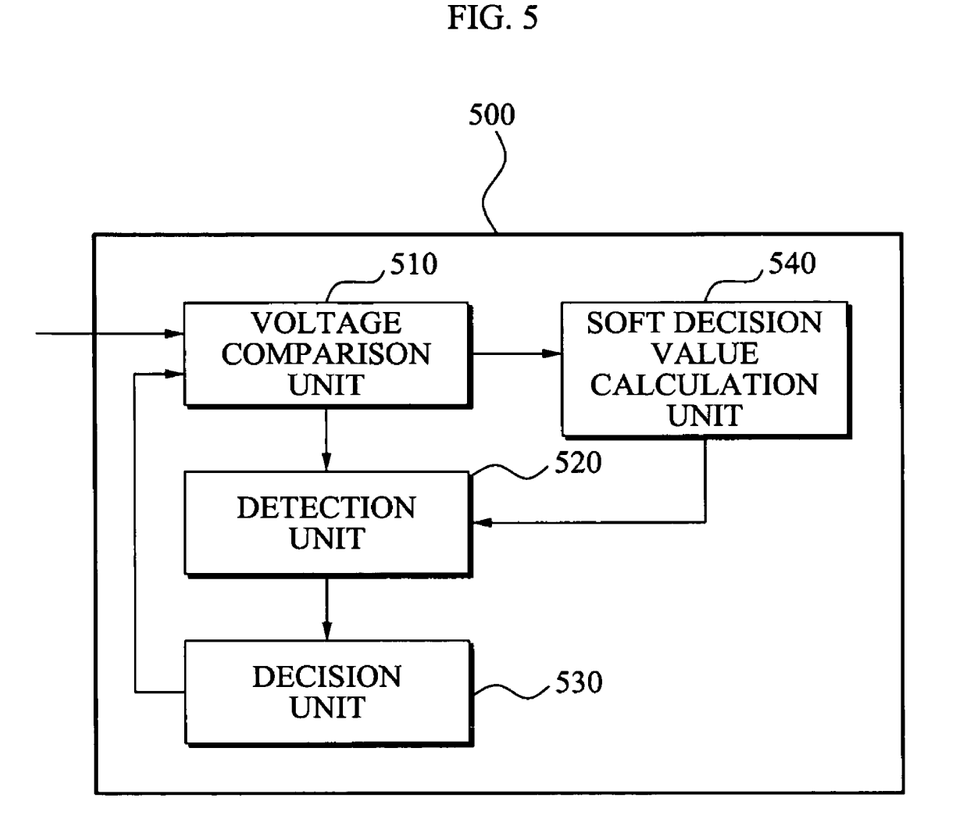
FIG. 5 is another block diagram illustrating a configuration of a data detecting apparatus according to example embodiments.

FIG. 5 is another block diagram illustrating a configuration of a data detecting apparatus according to example embodiments. Hereinafter, operations of the data detecting apparatus 500 according to example embodiments will be described by referring to FIG. 5. The data detecting apparatus according to example embodiments includes a voltage comparison unit 510, a detection unit 520, a decision unit 530, and a soft decision calculation unit 540.

The voltage comparison unit 510 may compare a reference voltage, associated with a specific data bit from among a plurality of data bits stored in a memory cell (not shown), with a threshold voltage in the memory cell. According to example embodiments, a range of the threshold voltage in the memory cell may be divided into a plurality of durations by a reference voltage associated with a specific data bit. The voltage comparison unit 510 may compare a threshold voltage with a reference voltage associated with the specific bit to be detected, and decide a duration including the threshold voltage.

The detection unit 520 may detect a value of the specific data bit based on the comparison result by the voltage comparison unit 510. According to example embodiments, the detection unit 520 may detect the specific bit by exclusively using the comparison result of the threshold voltage and the reference voltage associated with specific bit.

The decision unit 530 may decide whether the specific data bit is successfully detected based on whether an error occurs in the detected data.

When detection of the specific data bit fails, the detection unit 520 may re-detect a value of the specific data bit based on detection information with respect to a lower data bit than the specific bit. According to example embodiments, the detection information with respect to the lower data bit may be generated by comparing the threshold voltage in the memory cell with the reference voltage associated with the lower data bit.

According to example embodiments, the soft decision calculation unit 540 may calculate a soft decision value with respect to the specific data bit based on the detection information with respect to the lower data bit. The detection unit 520 may detect a value of the specific data bit based on the calculated soft decision value. The soft decision value may provide more detailed information with respect to a duration including the specific data bit. The detection unit 520 may detect more accurate data based on the detailed information, not rough information with respect to the duration including the threshold voltage.

Figure 6:
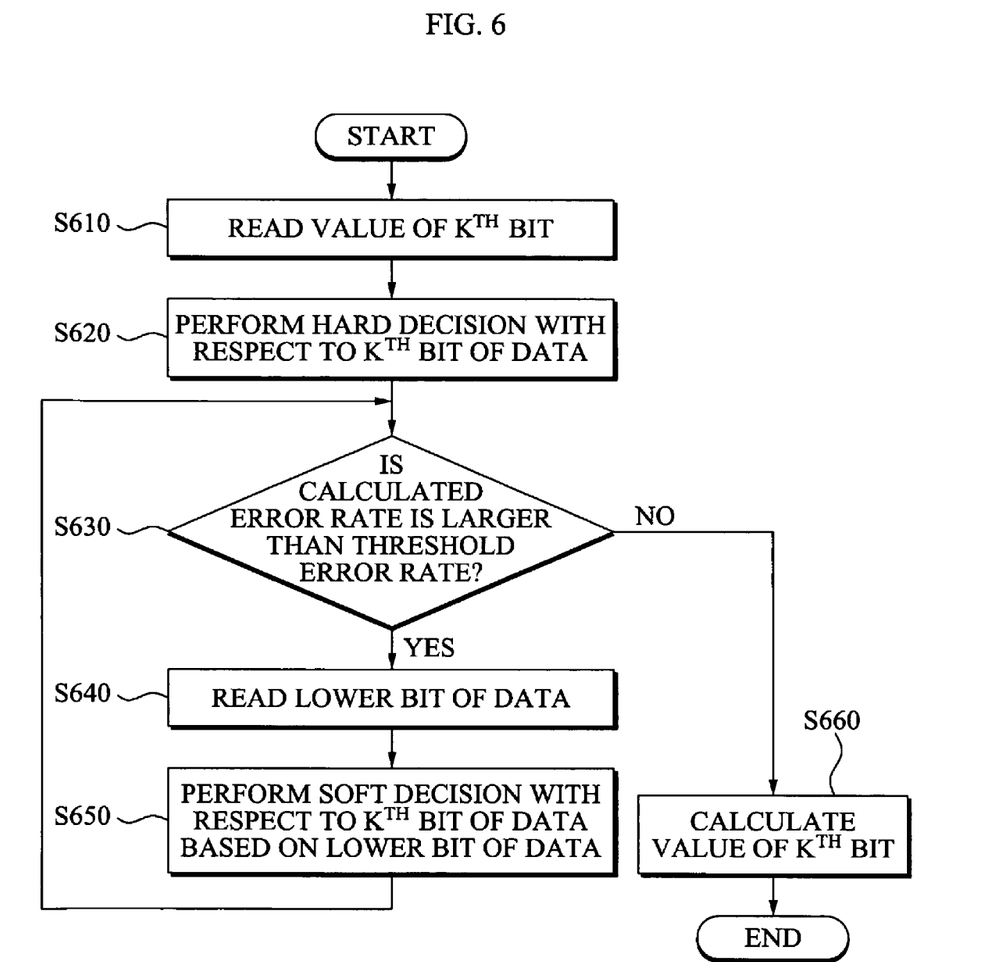
FIG. 6 a flowchart illustrating a method for detecting data stored in a memory cell according to example embodiments.

FIG. 6 a flowchart illustrating a method for detecting data stored in a memory cell according to example embodiments. Hereinafter, the method for detecting data stored in the memory cell according to example embodiments will be described in detail by referring to FIG. 6.

Detailed descriptions regarding operations S610 through S630 will be omitted since the detailed descriptions regarding operations S610 through S630 are similar to detailed descriptions regarding operations S410 through S430 of FIG. 4.

In operation S640, detection information may be generated with respect to a lower data bit by reading a data bit lower than a $k^{th}$ bit. According to example embodiments, the detection information with respect to the lower data bit may be generated by comparing the threshold voltage in the memory cell with the reference voltage associated with the lower data bit.

In operation S650, the $k^{th}$ data bit may be re-detected based on the detection information with respect to the lower data bit. According to example embodiments, a soft decision value may be calculated with respect to the $k^{th}$ data bit based on the detection information with respect to the lower data bit. According to example embodiments, data stored in the memory cell may be more accurately detected based on a soft decision value which provides more detailed information with respect to a duration including the threshold voltage in the memory cell. Next, the method may flow back to operation S630.

While example embodiments have been described in relation to either the lower data bit or the upper data bits, the lower bit and the upper data bit may be used interchangeably throughout example embodiments.

According to example embodiments, the data stored in the memory cell may be coded according to a predetermined error-correction coding scheme, and error-correction decoding may be performed according a soft decision decoding scheme in operation S650.

The method for detecting data according to example embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like Examples of program instructions include both machine code, such as produced by a compiler, and files containing higher level code that may be executed by the computer using an interpreter. The described hardware devices may be configured to act as one or more software modules in order to perform the operations of the above-described example embodiments.

While example embodiments have been particularly shown and described, it will be understood by those of ordinary skill in the art that various changes in form and details may be made therein without departing from the spirit and scope of example embodiments as defined by the following claims.

What is claimed is:

1. A data detecting apparatus, comprising:
a voltage comparison unit that compares a reference voltage, associated with a specific data bit from among a plurality of data bits stored in a memory cell, with a threshold voltage in the memory cell;
a detection unit that detects a value of the specific data bit based on a result of the voltage comparison unit; and
a decision unit that decides whether the specific data bit is successfully detected based on whether an error occurs in the detected data,
wherein the detection unit re-detects a value of the specific data bit based on detection information with respect to at least one of an upper data bit and a lower data bit in relation to the specific data bit, in response to a result of the decision unit.

2. The apparatus of claim 1, further comprising:
an error rate calculation unit that calculates an error rate of the detected data; and
an error rate comparison unit that compares the calculated error rate with a predetermined threshold error rate,
wherein the decision unit decides whether the data is successfully detected according to a result of the error rate comparison.

3. The apparatus of claim 2, wherein,
the data is error-correction coded according to a error-correction coding scheme, and
the error rate calculation unit decides whether an error occurs in the data according to the error-correction coding scheme and calculates the error rate based on a result of the decision.

4. The apparatus of claim 1, wherein,
the decision unit re-decides whether the specific data bit is successfully detected based on the re-detected data, and
the detection unit re-detects a value of the specific data bit based on detection information with respect to a lower data bit in relation to the specific data bit according to the decision unit.

5. The apparatus of claim 4, wherein the detection information with respect to the lower data bit is generated by comparing the reference voltage associated with the lower data bit to the threshold voltage.

6. The apparatus of claim 4, further comprising:
a soft decision calculation unit that calculates a soft decision value with respect to the specific data bit based on the detection information in response to the lower data bit,
wherein the detection unit detects a value of the specific data bit based on the calculated soft decision value.

7. The apparatus of claim 1, wherein,
the decision unit re-decides whether the specific data bit is successfully detected based on the re-detected data, and
the detection unit re-detects a value of the specific data bit based on detection information with respect to an upper data bit in relation to the specific data bit according to the decision unit.

8. The apparatus of claim 7, wherein the detection information is generated by comparing the reference voltage associated with the upper data bit to the threshold voltage.

9. The apparatus of claim 7, further comprising:
a soft decision calculation unit that calculates a soft decision value with respect to the specific data bit based on the detection information with respect to the upper data bit,
wherein the detection unit detects a value of the specific data bit based on the calculated soft decision value.

10. A method for detecting data, comprising:
comparing a reference value, associated with a specific data bit from among a plurality of data bits stored in a memory cell, with a threshold voltage in the memory cell;
detecting a value of the specific data bit based on the comparing the reference voltage; and
deciding whether the specific data bit is successfully detected based on whether an error occurs in the detected data,
wherein the detecting re-detects a value of the specific data bit based on detection information with respect to at least one of a lower data bit and an upper data bit in relation the specific data bit, according to the deciding.

11. The method of claim 10, further comprising:
calculating an error rate of the detected data; and
comparing the calculated error rate with a threshold error rate,
wherein the deciding decides whether the data is successfully detected based on the comparing the calculated error rate.

12. The method of claim 11, wherein,
the data is error-correction coded according to a error-correction coding scheme, and
the calculating of the error rate decides whether an error occurs in the data according to the error-correction coding scheme and calculates the error rate based on a result of the decision.

13. The method of claim 10, further comprising:
re-deciding whether the specific data bit is successfully detected based on the re-detected data, and
re-detecting a value of the specific data bit based on detection information with respect to the lower data bit according to the decision unit.

14. The method of claim 13, wherein the detection information with respect to the lower data bit is generated by comparing the reference voltage associated with the lower data bit with the threshold voltage.

15. The method of claim 13, further comprising:
calculating a soft decision value with respect to the specific data bit based on the detection information with respect to the lower data bit,
wherein the re-detecting of the specific data bit detects a value of the specific data bit based on the calculated soft decision value.

16. The method of claim 10, further comprising:
re-deciding whether the specific data bit is successfully detected based on the re-detected data, and
re-detecting a value of the specific data bit based on detection information with respect to the upper data bit according to the decision unit.

17. The method of claim 16, wherein the detection information with respect to the upper data bit is generated by comparing the reference voltage associated with the upper data bit with the threshold voltage.

18. The method of claim 16, further comprising:
calculating a soft decision value with respect to the specific data bit based on the detection information with respect to the upper data bit,
wherein the re-detecting of the specific data bit detects a value of the specific data bit based on the calculated soft decision value.

19. A computer-readable storage medium encoded with a computer program for implementing the method of claim of 10.

* * * * *